(12) United States Patent
Hiroi et al.

(10) Patent No.: US 6,940,069 B2
(45) Date of Patent: Sep. 6, 2005

(54) PATTERN INSPECTION METHOD AND APPARATUS USING ELECTRON BEAM

(75) Inventors: Takashi Hiroi, Yokohama (JP); Asahiro Kuni, Tokyo (JP); Masahiro Watanabe, Yokohama (JP); Chie Shishido, Yokohama (JP); Hiroyuki Shinada, Cyofu (JP); Yasuhiro Gunji, Hitachiohta (JP); Atsuko Takafuji, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/637,496

(22) Filed: Aug. 11, 2003

(65) Prior Publication Data

US 2004/0028272 A1 Feb. 12, 2004

Related U.S. Application Data

(63) Continuation of application No. 09/908,713, filed on Jul. 20, 2001, now Pat. No. 6,614,022.

(30) Foreign Application Priority Data

Jul. 21, 2000 (JP) ........................................ 2000-226181

(51) Int. Cl.$^7$ ............................ G01N 23/00; G21K 7/00
(52) U.S. Cl. .................. 250/310; 250/311; 250/559.27; 250/559.44; 250/559.45
(58) Field of Search .......................... 250/559.3, 559.27, 250/559.44, 559.4, 305, 306, 310, 307, 311

(56) References Cited

U.S. PATENT DOCUMENTS 5,502,306 A  3/1996  Meisburger et al.

FOREIGN PATENT DOCUMENTS

JP  2000-188310  7/2000
JP  2000-252330  9/2000

*Primary Examiner*—John R. Lee
*Assistant Examiner*—David A. Vanore
(74) *Attorney, Agent, or Firm*—Antonelli, Terry, Stout & Kraus, LLP

(57) ABSTRACT

A pattern inspection method which irradiates a charged particle beam onto a surface of a specimen on which a pattern is formed, simultaneously detecting with plural sensors secondary particles emanated from the surface of the specimen by the irradiation, adding signals outputted from each sensor of the plural sensors which simultaneously detected the secondary particles, obtaining an image of the surface of the specimen on which the pattern is formed from the added signals and processing the image to detect a defect of the pattern.

11 Claims, 10 Drawing Sheets

PATTERN INSPECTION METHOD AND APPARATUS USING ELECTRON BEAM

CROSS REFERENCE TO RELATED APPLICATION

This is a continuation of U.S. application Ser. No. 09/908,713, filed Jul. 20, 2001, now U.S. Pat. No. 6,614,022, the subject matter of which is incorporated by reference herein.

BACKGROUND OF THE INVENTION

The present invention relates to a substrate manufacturing apparatus including circuit patterns such as semiconductor devices and liquid crystal and particularly to the technique for inspecting the patterns of substrate in the course of the manufacture using SEM.

A pattern inspecting apparatus using the electron beam of the related art is described, for example, in the official gazette of Japanese Laid-Open Patent Application No. 258703/1993. An example of the pattern inspection apparatus using electron beam described in the above cited reference is illustrated in FIG. 1. An electron beam 2 emitted from an electron beam source 1 is deflected with a deflector 3 in the X direction, this electron beam irradiates an object substrate 5 via an objective lens 4, the secondary electron 7 (including the secondary electron and reflected electron generated from a sample through irradiation of the primary electron beam) emitted from the object substrate 5 is simultaneously deflected with an E×B deflector (hereinafter referred to as only E×B) 13 while a stage 6 is continuously moved in the Y direction, this secondary electron beam 7 is detected with a detector 8 as an electric signal and it is then amplified with a pre-amplifier 14, thereafter the detected signal is A/D-converted with an A/D converter 9 to obtain a digital image, this image is then compared with a digital image at the area which may be expected as to be identical in an image processing circuit 10, thereby an area generating a difference is detected as a pattern defect 11 to identify the defective area. The object substrate 5 is kept at a negative potential with the retarding voltage and therefore an acceleration voltage can easily be changed on the object substrate 5 by changing the retarding voltage 12.

In the apparatus of the related art as illustrated in FIG. 1, the secondary electron 7 has been detected with convergence to one detector 8. However, a degree of convergence of the secondary electron is restricted with various conditions. As the restricting conditions, it is possible to consider (1) degree of freedom of the electro-optical system (retarding voltage, current of primary beam, electric field of the area near the sample, etc. for controlling the acceleration voltage of the primary electron incident to the sample), (2) deflection of the electron beam 2 with the deflector 3 for scanning the sample, (3) allowance of setting, (4) contamination of surface of the detector 7 generated with collision of electron beam and (5) various aberrations in the electro-optical system, or the like.

Although depending on the practical design of the electro-optical system, the conditions (4) and (5) contribute to the degree of convergence of secondary electron and the minimum degree may be estimated as about 1 mm under the condition of the electro-optical system, that is, under the condition that the retarding voltage, current of primary beam and field at the area near the sample which control the acceleration voltage of the primary electron incident to the sample is fixed to only one condition. Moreover, the influence on the degree (2) of convergence of the secondary electron due to the scanning of the deflector 3 with the electron beam 2 appears as the movement of the converging position of about 0.5 mm, although depending on the scanning width and magnifying factor for the secondary electron. Moreover, in regard to the degree of freedom (1) of the optical system, a degree of convergence is changed for about 1 mm by the defocusing, although depending on the other conditions, when the retarding voltage 12, for example, is changed.

Moreover, in actual, since the optical axis of the secondary electron optical system is deviated, it can be estimated that the converging position is shifted by about 0.5 mm. When these factors are added, the diameter of about 3 mm is required for the effective light receiving surface of the detector to detect the secondary electron and when the allowance of setting (3) is considered, the diameter of 4 mm will be required for the effective light receiving surface of the photosensor.

Meanwhile, the frequency characteristic of detector is inversely proportional to the area of the detector. For example, in the case of the detector having the diameter of 4 mm, the cut-off frequency is only 75 MHz even when the design condition and operating condition are improved. On the other hand, when the diameter of detector is set to 2 mm, the cut-off frequency becomes about 150 MHz. However, as explained above, since the detector of the related art requires a diameter of 4 mm, response is possible only for 15 Msps (sps: sample per second) of the sampling frequency corresponding to the cut-off frequency of 75 MHz and it has been impossible to respond to the higher frequency.

SUMMARY OF THE INVENTION

The present invention can provide an inspection apparatus using SEM which can sufficient detect the secondary electron even at the sampling frequency higher than 150 Msps which has been difficult in the structure of the related art to sufficiently cover the detection of secondary electron.

The first means for embodying the present invention is illustrated in FIG. 2.

Here, the structure for solving the problems will be explained, for easier understanding, for detection at the 400 Msps rate under the assumption that a size of detector is 4 mm square (in above example, the diameter is set to 4 mm, but here the detector has the size of 4 mm square), cut-off frequency is 75 MHz and the cut-off frequency is inversely proportional to only the area. Of course, the numerical values also change depending on the internal structure and material of sensor, but these are not explained here. The contents explained above is the essential factors for the case where the target of speed is set to 400 Msps or more. Moreover, the number of detectors is set, for example, to four, but it is selected as the typical value of a plurality of detectors and the present invention is never limited only to the numerical value 4.

The first means is composed of an electron source 1 for generating the electron beam 2, a deflector 3 for deflecting the electron beam 2, an objective lens 4 for converging the electron beam 2 on the object substrate 5, a stage 6 for holding the object substrate 5 to apply the retarding voltage 12 for the scanning and positioning, E×B 13 for deflecting the secondary electron 7 emitted from the object substrate 5, a 4-split detector 20 of 2 mm square each for detecting the secondary electron 7 deflected with the E×B 13, preamplifiers 21a to 21d having the bandwidth of 200 MHz or higher connected to each detector, an A/D converter 22 of 400 Msps for adding and A/D-converts outputs of the preamplifiers 21a to 21d to obtain the digital image and an image processing circuit 10 for detecting, from the digital image, an area generating difference as a defect 11 through comparison with the digital image of the area intrinsically providing expectation for the matching of images.

In above structure, the electron beam 2 from the electron source 1 is deflected in the X direction with the deflector 3, this electron beam 2 irradiates the object substrate 5 via the object lens 4, the secondary electron 7 from the object substrate 5 is bent with ExB 13 for detection with the 4-split detector 20 while the stage 6 is continuously moved in the Y direction, the signal is A/D-converted to obtain the digital image after the signal of each split detector into voltage with the preamplifiers 21a to 21d and the signals are added with the A/D converter and the image processing circuit 10 detects the area generating difference as the defect 11 through comparison with the digital image of the area intrinsically providing expectation for the matching of images. In this case, the secondary electron 7 can be expanded only to the maximum area of 4 mm square even when change of retarding voltage 12 and deflection with the deflector 3 are considered.

Since the 4-split detector 20 is completed in 4 mm square with four detectors, while one detector is completed in 2 mm square, the secondary electron 7 enters any one of the sensors. The signal of any detector is received with the preamplifiers 21a to 21d and these signals are added in the A/D converter 22 to A/D-convert all secondary electrons 7. Since each detector is completed in the 2 mm square, the cut-off frequency is set to 300 MHz, bandwidth of the preamplifier is set to 200 MHz and A/D converter is set to 400 Msps, the detector, preamplifier and A/D converter are designed to cover 400 Msps and sufficient consideration is taken for 400 Msps.

When a 6-split or 8-split and moreover 12-split detector is used in place of the 4-split detector to provide the structure to detect the secondary electron, area of each detector can further be reduced and moreover it is now possible to further quickly detect the secondary electron than 400 Msps explained above.

Next, the second means for embodying the present invention is illustrated in FIG. 3 and is composed of an electron beam source 1 for generating the electron beam 2, a deflector 3 for deflecting the electron beam 2, an objective lens 4 for converging the electron beam 2 on the object substrate 5, a stage 6 for holding the object substrate 5 to apply the retarding voltage 12 for scanning or positioning, ExB 13 for bending the secondary electron 7 from the object substrate 5, a secondary electron deflector 30 for deflecting the secondary electron 7 bent with ExB 13, 4-split detectors 31a to 31d each of which has the 4 mm square size for detecting the secondary electron or the like deflected with the secondary electron deflector 30, preamplifiers 32a to 32d of 50 MHz bandwidth connected to each detector, A/D converters 33a to 33d of 100 Msps for converting the outputs of preamplifiers 32a to 32d to the digital image and an image processing circuit 10 for detecting, from the digital image, an area generating difference as the defect 11 through comparison with the digital image of the area providing expectation for the matching of images.

With introduction of such structure, the electron beam 2 from the electron beam source 1 is deflected in the X direction with the deflector 3 to irradiate the object substrate 5 via the objective lens 4, the secondary electron 7 from the object substrate 5 is bent with ExB 13 while the stage 6 is simultaneously moved continuously in the Y direction, thereafter the secondary electron deflector 30 is driven with 100 MHz to sequentially scan each detector of the 4-split detector 20 for detection with the 4-split detector 31, the signal obtained is then amplified with the preamplifiers 32a to 32d and the signal of each split detector is converted to the voltage, the signal is then A/D-converted to the digital image signal with the A/D converters 33a to 33d and the image processing circuit 10 compares the digital image with that of the area intrinsically providing the expectation for matching of the image and detects the area generating difference as the defect 11. In this case, the secondary electron 7 can be spread in maximum to the area of 4 mm square even when considering, for example, the change of retarding voltage 12 and deflection by the deflector 3.

Since each 4-split sensor has the size of 4 mm square, the secondary electron 7 is all incident to the detector selected with the secondary electron deflector 30. The signal of any detector is received with the pre-amplifiers 32a to 32d and these signals are then A/D-converted with the A/D converters 33a to 33d. The detector has a size of 4 mm square, cut-off frequency is 75 MHz, bandwidth of preamplifier is 50 MHz and the A/D converter has 100 Msps. Therefore, the detector, preamplifier and A/D converter is responsible to 100 Msps and moreover the sampling is conducted once for four pixels at 100 Msps. Accordingly, sufficient consideration for 400 Msps can be made with the total function of pairing of four detectors, preamplifiers and A/D converters.

Operations of the secondary electron deflector 30 will be explained in detail with reference to FIG. 10. The secondary electron deflector 30 is switched, in units of 2.5 ns, in the sequence of a, b, c, d with the period of 100 MHz. The A/D converter 33 samples the signal in the 10 ns period and 100 Msps and obtains in total 400 Msps by sequentially arranging the outputs of the four A/D converters.

Operating method of the secondary electron deflector 30 will be explained with reference to FIG. 11. The circle scanning 92 for continuously moving the secondary electron 7 on the detecting surfaces of the 4-split detectors 31a to 31d can be realized by defining respectively the X/Y deflection signals as sin/cos signals. Moreover, the switching scanning 93 for discretely scanning the secondary electron 7 on the detecting surfaces of the 4-split detectors 31a to 31d can also be realized by defining the X/Y deflection signals as the square waves of 10 ns period resulting in the deviation of phase of 90 degrees. In addition, although not illustrated, the similar signals can also be obtained by defining the X/Y deflection signal as the square waves of 10 ns and 5 ns periods.

The third means for embodying the present invention is illustrated in FIG. 4 and is composed of an electron beam source 1 for generating the electron beam 2, a deflector 3 for deflecting the electron beam 2, an objective lens 4 for converging the electron beam 2 on the object substrate 5, a stage 6 for holding the object substrate 5 to apply the retarding voltage 12 for scanning or positioning, an ExB 13 for bending the secondary electron 7 from the object substrate 5, a 4-split smart detector 40 each of which has a size of 2 mm square integrating a preamplifier and an adder for detecting the secondary electron 7 bent with the ExB 13, an A/D converter 41 of 400 Msps for converting an output of the 4-split smart detector 40 into a digital image and an image processing circuit 10 for detecting, from the digital image, the area generating difference as the defect 11 through comparison with the digital image of the area intrinsically providing expectation for matching of images.

With introduction of this structure, the electron beam 2 from the electron beam source 1 is deflected in the X direction with the deflector 3 to irradiate the object substrate 5 via the objective lens 4, the secondary electron 7 from the object substrate 5 is bent with the E×B 13 while simultaneously moving the stage 6 in the Y direction continuously, thereafter the electron beam 7 is then detected with the smart detector 40 and A/D-converted into the digital image with the A/D converter 41 and the image processing circuit 10 detects, from the digital image, the area generating difference as the defect 11 through comparison with the digital image of the area intrinsically providing the expectation for matching of images.

In this case, the secondary electron 7 can be spread in maximum up to the area in size of 4 mm square even when considering the change of retarding voltage 12 and deflection with the deflector 3. Since one 4-split sensor as the size of 2 mm square and the four sensors also have the size of 2 mm square, the electron beam is incident to any one of the four sensors. The signal of any detector is received with a preamplifier provided to each sensor built in the smart detector 40 and the signal of all secondary electrons 7 can be obtained as the output of the smart detector 40 by adding such signals from the detector. When the bandwidth of the preamplifier built in the smart detector 40 is set to 200 MHz, since the detector has the size of 2 mm square, the cut-off frequency is 300 MHz and A/D converter has 400 Msps, the detector, preamplifier and A/D converter are responsible to 400 Msps because of sufficient consideration for 400 Msps.

The fourth means for embodying the present invention is illustrated in FIG. 5 and is composed of an electron beam source 1 for generating the electron beam 2, a deflector 3 for deflecting the electron beam 2, an objective lens 4 for converging the electron beam 2 on the object substrate 5, a stage 6 for holding the object substrate 5 to apply the retarding voltage 12 for scanning or position, a E×B 13 for bending the secondary electron 7 from the object substrate 5, a converging optical system 51 for converging the secondary electron 7 bent with the E×B 13, a detector 8 of 2 mm square for detecting the secondary electron 7 converged with the converging optical system 51, a preamplifier 52 having the bandwidth of 200 MHz or more connected to the detector, an A/D converter 9 of 400 Msps for converting an output of the preamplifier 52 to the digital image through the A/D conversion and an image processing circuit 10 for detecting, from the digital image, the area generating difference as the defect 11 through comparison with the digital image of the area intrinsically providing expectation for matching of images.

With introduction of the structure explained above, the electron beam 2 from the electron beam source 1 is deflected in the X direction with the deflector 3 to irradiate the object substrate 5 via the objective lens 4, the secondary electron 7 from the object substrate 5 is bent with the E×B 13 having optimized the bending angle for each retarding voltage while simultaneously moving continuously the stage 6 in the Y direction, thereafter the secondary electron 7 converged to the position depending on the retarding voltage with the converging optical system 51 is detected with the detector 8 of 2 mm square, the signal is then amplified with the preamplifier 52 and A/D-converted to the digital image with the A/D converter 9 and the image processing circuit 10 detects the area generating difference as the defect 11 through comparison with the digital image of the area intrinsically providing expectation for matching of images.

In this case, the spreading by defocusing and movement of converging position when the retarding voltage 12 is changed are respectively adjusted with the converging optical system 51 and E×B 13. Therefore, even when deflection by the deflector 3 is considered, the secondary electron 7 is spread in maximum up to the area of 1.5 mm square+design allowance. Here, the detector 8 is rather small in size because one detector has the size of 2 mm square but since the electron beam is incident to the detector, the signal of almost all secondary electrons 7 can be obtained as an output of the detector 8. When the bandwidth of preamplifier is set to 200 MHz, since the detector has the size of 2 mm square, cut-off frequency is 300 MHz, A/D converter has 400 Msps, the detector, preamplifier and A/D converter are responsible to 400 Msps with sufficient consideration for 400 Msps.

The fifth means for embodying the present invention is illustrated in FIG. 6 and is composed of an electron beam source 1 for generating the electron beam 2, a deflector 3 for deflecting the electron beam 2, an objective lens 4 for converging the electron beam 2 on the object substrate 5, a stage 6 for holding the object substrate 5 to apply the retarding voltage 12 for scanning or positioning, an E×B 13 for bending the secondary electron 7 from the object substrate 5, detectors 61a to 61b in size of 2 mm square provided in a plurality of positions for detecting the secondary electron 7 bent with the E×B 13, preamplifiers 62a to 62b having the bandwidth of 200 MHz or higher connected to each detector, a signal combining circuit 63 for adding or switching outputs of the preamplifiers 62a to 62b, an A/D converter 9 of 400 Msps for converting the signal combined with the signal combining circuit 63 into the digital image and an image processing circuit 10 for detecting, from the digital image, the area generating difference as the defect 11 through comparison with the digital image of the area intrinsically providing expectation for matching of images.

With introduction of such structure, the sharing range of the retarding voltage 12 of the detector 61a is defined as Vamin to Vamax and the sharing range of the retarding voltage 12 of the detector 61b is defined as Vbmin to Vbmax, the detectors 61a to 61b are provided at the converging distance of the secondary electron 7 corresponding to the retarding voltage 12 of the sharing range with the setting for covering the range of all retarding voltages 12 when these are added. When the retarding voltage 12 is in the range of Vamin to Vamax, the detector 61a is selected with the signal combining circuit 63 and E×B 13 is set to apply the electron beam to the detector 61a.

The electron beam 2 emitted from the electron beam source 1 is deflected in the X direction with the deflector 3 to irradiate the object substrate 5 via the objective lens 4, the secondary electron 7 from the object substrate 5 is then bent with the E×B 13 having optimized the bending angle while simultaneously moving continuously the stage 6 in the Y direction, thereafter the secondary electron 7 is then detected with the detector 61a in the size of 2 mm square and is then amplified with the preamplifier 62a, thereafter the signal is A/D-converted to the digital image in the A/D converter 9 because the detector 61a is selected in the signal combining circuit and the image processing circuit 10 detects, from the digital image, the area generating difference as the defect 11 through comparison with the digital image of the area intrinsically providing expectation for matching of images.

In this case, since the spread by defocusing and movement of converging position when the regarding voltage 12 is changed are adjusted with selection of the detectors 61a to 61b and adjustment with E×B 13, the secondary electron 7 can be spread in maximum to the area of 1.5 mm square+ design allowance even when considering the deflection with the deflector 3. Since one detector of 61a to 6b has the size of 2 mm square with smaller allowance and the electron beam enters the detector, the signal of almost all secondary electrons 7 can be obtained as an output of the detectors 61a to 61b. When the bandwidth of the preamplifier is set to 200 MHz, since the sensor has the size of 2 mm square, cut-off frequency is 300 MHz and A/D converter has 400 Msps, the detector, preamplifier and A/D converter are responsible to 400 Msps with sufficient consideration for 400 Msps.

The sixth means for embodying the present invention is illustrated in FIG. 7 and is composed of an electron beam source 1 for generating the electron beam 2, a deflector 3 for deflecting the electron beam 2, an objective lens 4 for converging the electron beam 2 on the object substrate 5, a stage 6 for holding the object substrate 5 to apply the retarding voltage 12 for scanning or positioning, a E×B 13 for bending the secondary electron 7 from the object substrate 5, a secondary electron returning deflector 71 for deflecting the secondary electron 7 bent with the E×B 13, a detector 72 in size of 2 mm square for detecting the secondary electron 7 returned with the returning deflector 71, a preamplifier 73 having the bandwidth of 200 MHz or more connected to the detector 72, an A/D converter 9 of 400 Msps for A/D-converting the output of preamplifier 73 to the digital image and an image processing circuit 10 for detecting, from the digital image, the area generating difference as the defect 11 through comparison with the digital image of the area intrinsically providing expectation for matching of images.

With introduction of the structure explained above, the electron beam 2 from the electron beam source 1 is deflected in the X direction with the deflector 3 to irradiate the object substrate 5 via the objective lens 4, the second electron 7 from the object substrate 5 is bent with the E×B 13 having optimized the bending angle for each retarding voltage while simultaneously moving the stage 6 continuously in the Y direction, thereafter the secondary electron 7 is detected with the detector 72 in the size of 2 mm square by returning amount of movement on the detector 72 at the deflector 3 with the secondary electron returning deflector 71 in order to eliminate movement of secondary electron 7 and this secondary electron 7 is then amplified with the preamplifier 73, thereafter the signal is A/D-converted to the digital image with the A/D converter 9 and the image processing circuit 10 detects the area generating difference as the defect 11 through comparison with the digital image of the area intrinsically providing expectation for matching of images.

In this case, movement of converging position when the retarding voltage 12 is changed is adjusted with the E×B 13. Moreover, since the secondary electron returning deflector 71 is used for movement of the secondary electron 7 resulting from the scanning of the deflector 3, the secondary electron 7 is spread in maximum only up to the area of 2 mm square+design allowance. The detector 72 does not have allowance because it has the size of 2 mm square, but since the electron beam is incident to the detector, the signal of the secondary electron 7 can be defined as the output of the detector 72. When the bandwidth of preamplifier is set to 200 MHz, since the detector has the size of 2 mm square, cut-off frequency is 300 MHz and A/D converter has 400 Msps, the detector, preamplifier and A/D converter are responsive for 400 Msps with sufficient consideration for 400 Msps. This structure cannot achieve the target with itself but it is possible to use this structure to attain the design allowance through combination, for example, with the structure of the fifth means.

The seventh means for embodying the present invention is illustrated in FIG. 8 and is composed of an electron beam source 1 for generating the electron beam 2, a deflector 3 for deflecting the electron beam 2, an objective lens 4 for converging the electron beam 2 on the object substrate 5, a stage 6 for holding the object substrate 5 to apply the retarding voltage 12 for scanning or positioning, a E×B 13 for bending the secondary electron 7 from the object substrate 5, a reflector 81 for collision with the secondary electron 7 bent with the E×B 13, a converting optical system 83 for converging the secondary electron 82 generated with the secondary electron 7 collided with the reflector 81, a detector 84 of 2 mm square for detecting the secondary electron 82 converged with the converging optical system 83, a preamplifier 85 having the bandwidth of 200 MHz or higher connected to the detector 84, an A/D converter 9 of 400 Msps for A/D-converting output of the preamplifier 85 to the digital image and an image processing circuit 10 for detecting, from the digital image, the area generating difference as the defect 11 through comparison with the digital image of the area intrinsically providing expectation for matching of images.

In the structure of the detector using a plurality of detectors, those having reduced, as much as possible, the non-effective area in the periphery of the detector is provided adjacently. At least non-effective area of 0.2 mm is required when it is reduced as much as possible. When these are allocated without any interval, the detectors may be allocated by providing the non-effective area of 0.4 mm. In this method, a plurality of detectors may be integrated at the time of manufacturing the detector. Although depending on the process, it is possible to provide the non-effective area of 0.02 mm or less. FIG. 9 illustrates an example where five detectors 91a to 91e are used as the detector.

With introduction of the structure explained above, the electron beam 2 from the electron beam source 1 is deflected in the X direction with the deflector 3 to irradiate the object substrate 5 via the objective lens 4, the secondary electron 7 from the object substrate 5 is bent with the E×B 13 having optimized the bending angle for each retarding voltage, thereafter the secondary electron 7 is collided with the reflector 81 and the secondary electron 82 generated at the reflector 81 is then detected with the detector 84 of 2 mm square via the converging optical system 83, the signal is amplifier with the preamplifier 85 and is then A/D-converted to the digital image of the A/D converter 9 and the image processing circuit 10 detects the area generating difference as the defect 11 through comparison with the digital image of the area intrinsically providing expectation for matching of images.

In this case, since the electron beam 7 is once collided with the reflector 81, the secondary electron 82 almost having no energy is generated not depending on the retarding voltage 12 and scanning by the deflector 3 and this secondary electron 82 is inputted to the detector 84 with the converging optical system 83. Accordingly, the secondary electron 82 is spread in maximum to the area of 2 mm square. Since the detector 84 has the size of 2 mm square, the signal of all secondary electron 7 can be obtained as the output of detector 84. When the bandwidth of a preamplifier is set to 200 MHz, since the detector is in the size of 2 mm square, cut-off frequency is 300 MHz and A/D converter has 400 Msps, the detector, preamplifier and A/D converter are responsible for 400 Msps with sufficient consideration for 400 Msps.

In the means and operation to solve the problems explained above, the converging position to the detector is adjusted with E×B, but it is also possible to realize the function to adjust the position of secondary electron or the like to the detector by inserting the secondary electron deflector in the optical path of only the secondary electron, in place of allowing both the electron beam and secondary electron to pass the circuits other than E×B. Moreover, since a large aberration is generated if the electron beam is deflected to a large extent with the E×B, it can be thought to cancel the aberration by adding a dummy E×B for operating in the inverse direction.

These and other objects, features and advantages of the invention will be apparent from the following more particular description of preferred embodiments of the invention, as illustrated in the accompanying drawings.

DESCRIPTION OF THE PREFERRED EMBODIMENTS

Figure 12:
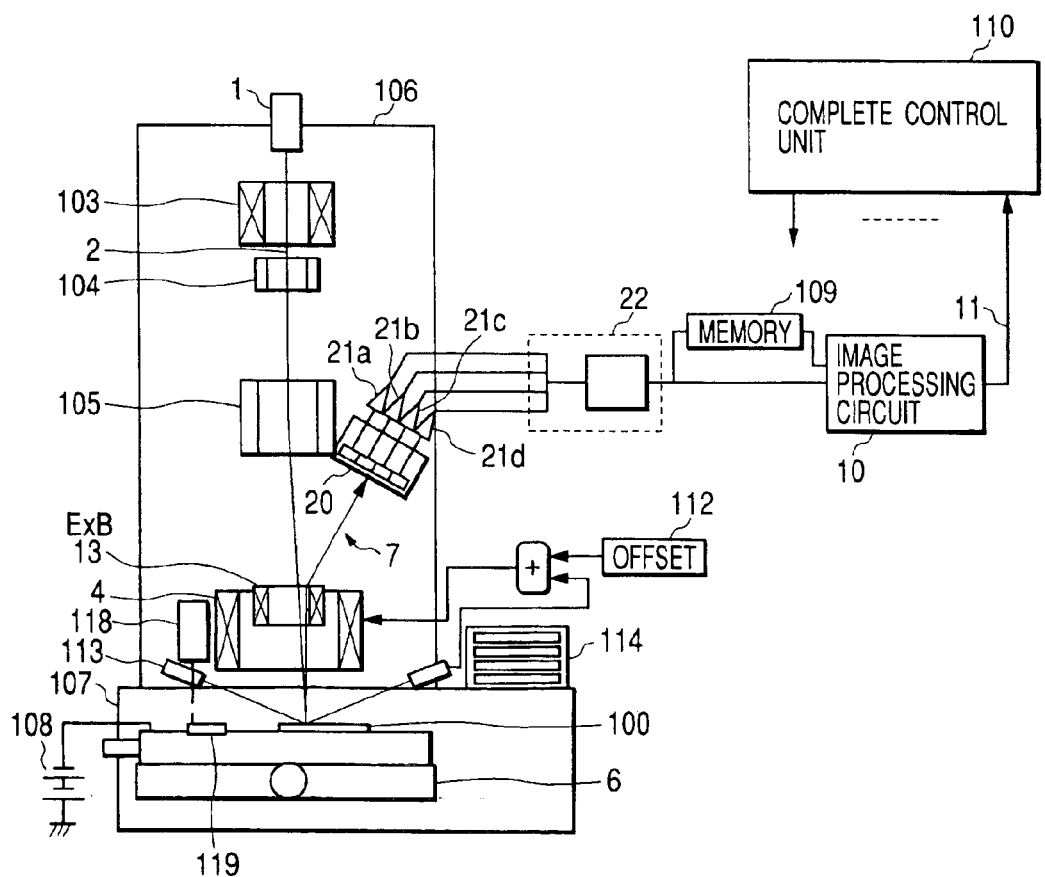
FIG. 12 is a front elevation illustrating the schematic structure of the apparatus in relation to the first embodiment.

The preferred embodiments of the present invention will be explained below.
[Embodiment 1]
The first embodiment of the present invention will be explained. FIG. 12 illustrates a structure of the first embodiment.

The first embodiment comprises an electron beam source 1 for generating the electron beam 2, an electro-optical system 106 consisting of a condenser lens 103 for converging the electron beam 2 from the electron beam source 1 to the constant area, a blanking plate 104 installed near the converging position of the condenser lens 103, a deflector 105 for deflecting the electron beam 2 in the XY directions and an objective lens 4 for converging the electron beam 2 on the object substrate, a sample chamber 107 for holding a wafer 100 as the object substrate in the evacuated condition, a stage 6 for mounting the wafer 100 to apply the retarding voltage 108 to enable detection of an image at the desired position, a E×B 13 for deflecting the secondary electron 7 from the wafer 100 in the direction to the detector 20, a 4-split detector 20 using four detecting elements of 2 mm square having the bandwidth of 200 MHz to detect the deflected secondary electron 7, preamplifiers 21a to 21d having the bandwidth of 200 MHz allocated within the sample chamber held in the evacuated condition, an A/D converter 22 for obtaining the digital image by adding outputs of the preamplifiers 21a to 21d and A/D-conducting the added outputs at 400 Msps, a memory 109 for storing the digital image, an image processing circuit 10 for detecting the area generating difference as the pattern defect 11 through comparison of the digital image stored in the memory 109 with the A/D converted digital image, a complete control unit 110 (the control line from the complete control unit 110 is omitted), a Z-sensor 113 for keeping constant the focal position of the digital image detected by adjusting the focal position of the electron beam 2 converged on the object substrate 5 by measuring the height of wafer 100 and controlling a current value of the objective lens 4 with addition of offset 112, a loader (not illustrated) for loading and unloading the wafer 100 in the cassette 114 to and from the sample chamber 107, an orientation flat detector (not illustrated) for positioning the wafer 100 with reference to the external shape of the wafer 100, an optical microscope 118 for observing the pattern on the wafer 100 and a standard sample piece 119 provided on the stage 6.

Figure 1:
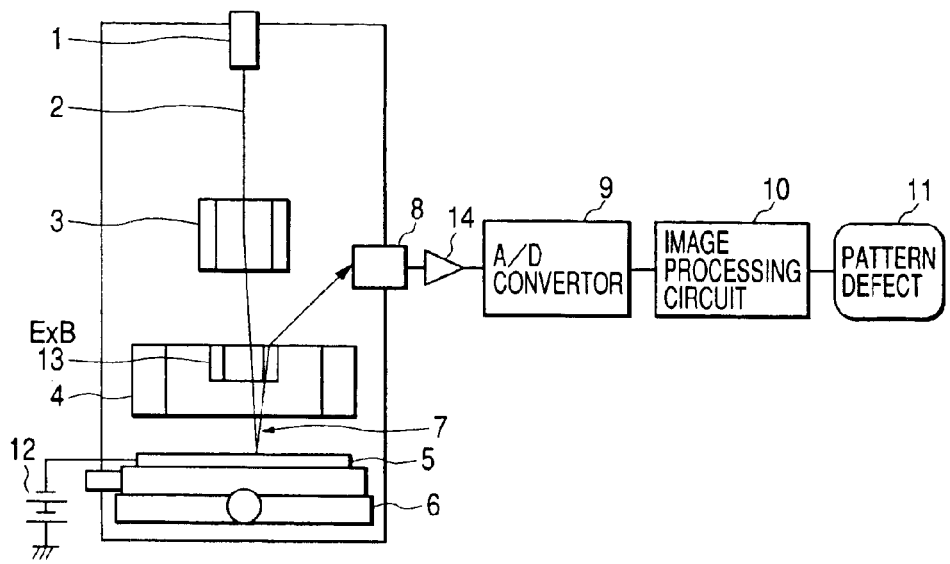
FIG. 1 is a front elevation illustrating the schematic structure of the pattern inspection apparatus using the electron beam of the related art.
Figure 2:
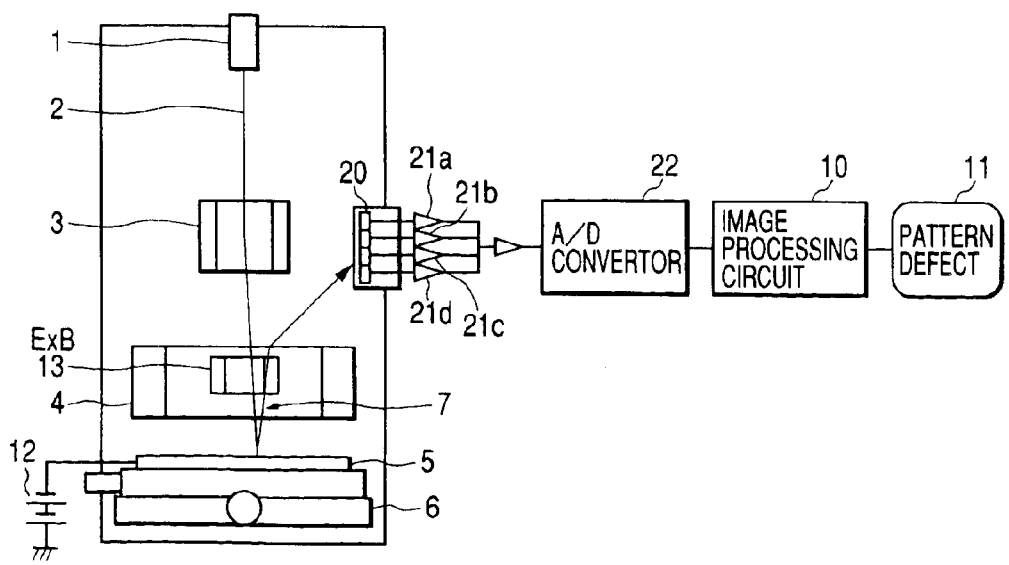
FIG. 2 is a front elevation illustrating the schematic structure of the first means of the present invention.

The detector 20 described in this embodiment has the same structure as that described in FIG. 2.

Operations of the first embodiment will be explained. The complete control unit 110 instructs the operation of each unit in the following procedures. An instruction is issued to a loader (not illustrated) and the loader picks up the wafer 100 from the cassette 114, positions the wafer with reference to the external shape with the orientation flat detector (not illustrated), loads the wafer 100 to the stage 6 and evacuates the inside of sample chamber 107. Upon completion of loading, the conditions of the electro-optical system 106 and retarding voltage 108 are set and a voltage is applied to the blanking plate 104 to turn off the electron beam 2.

Next, the stage is moved to the standard sample piece 119 to validate the Z-sensor 113 in order to keep the focal point to the constant area of the detection value+offset 112 of the Z-sensor, the deflector 105 is caused to conduct raster-scanning, the voltage of the blanking plate 104 is turned off in synchronization with the scanning, the wafer 100 is irradiated with the electron beam 2 when it is required, the secondary electron 7 generated from the wafer 100 is detected with the 4-split detector 20 and is then amplified with the preamplifiers 21a to 21d, thereafter the secondary electrons 7 are added and are then A/D-converted to the digital image with the AD converter 22. Here, the offset 112 is changed to detect a plurality of digital images and the optimum offset to provide the maximum total sum in the image of the differential values of the images in the complete control unit 110 for each detection is set as the current offset value.

Figure 13:
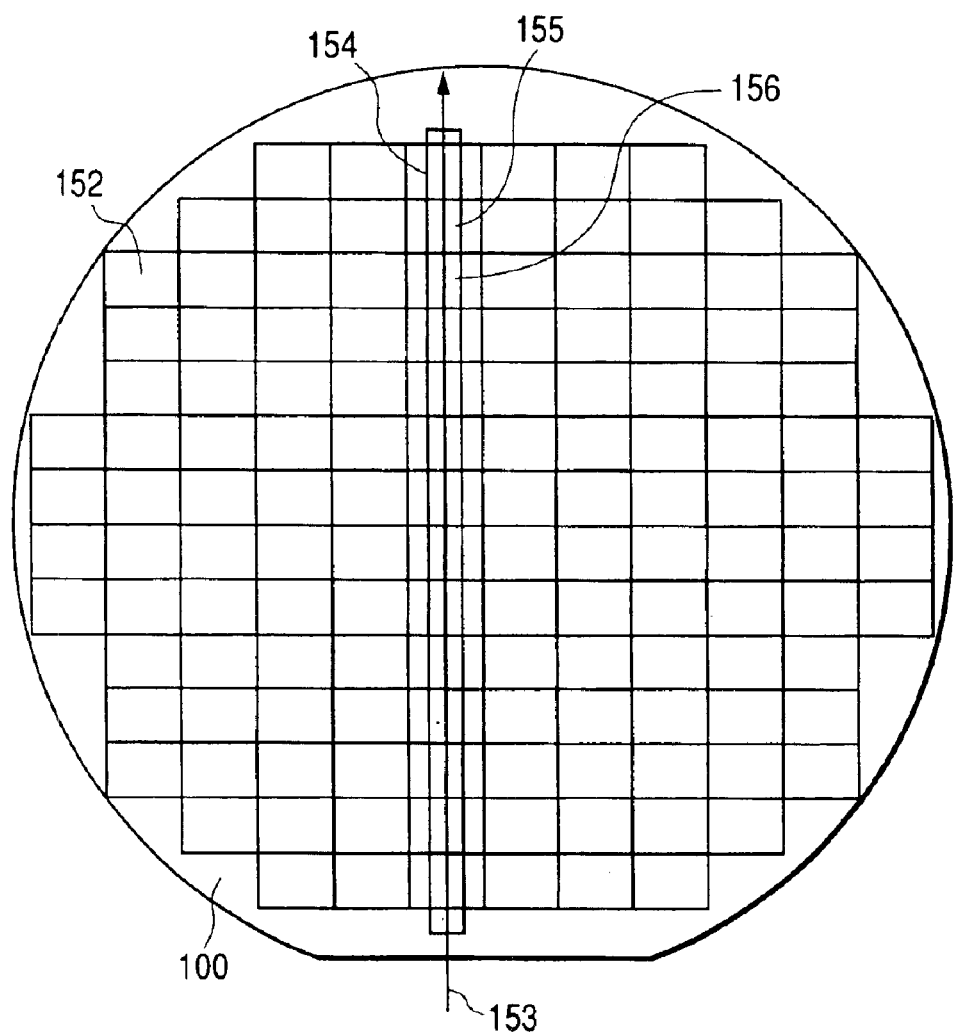
FIG. 13 is a plan view of a wafer for explaining the sequence of inspection.

Next, the stage 6 is moved to the scanning start position of the area to be inspected of the loaded wafer 100. The intrinsic offset of the wafer which has been measured previously is added to the offset 112 for the setting to validate the Z-sensor 113, the stage 6 is then scanned in the Y direction along the scanning line 153 illustrated in FIG. 13, the deflector 105 scans in the X direction in synchronization with the scanning of stage and the voltage of the blanking plate 104 is turned off at the time of effective scanning so that the electron beam 2 irradiates the wafer 100 for the scanning purpose.

Figure 14:
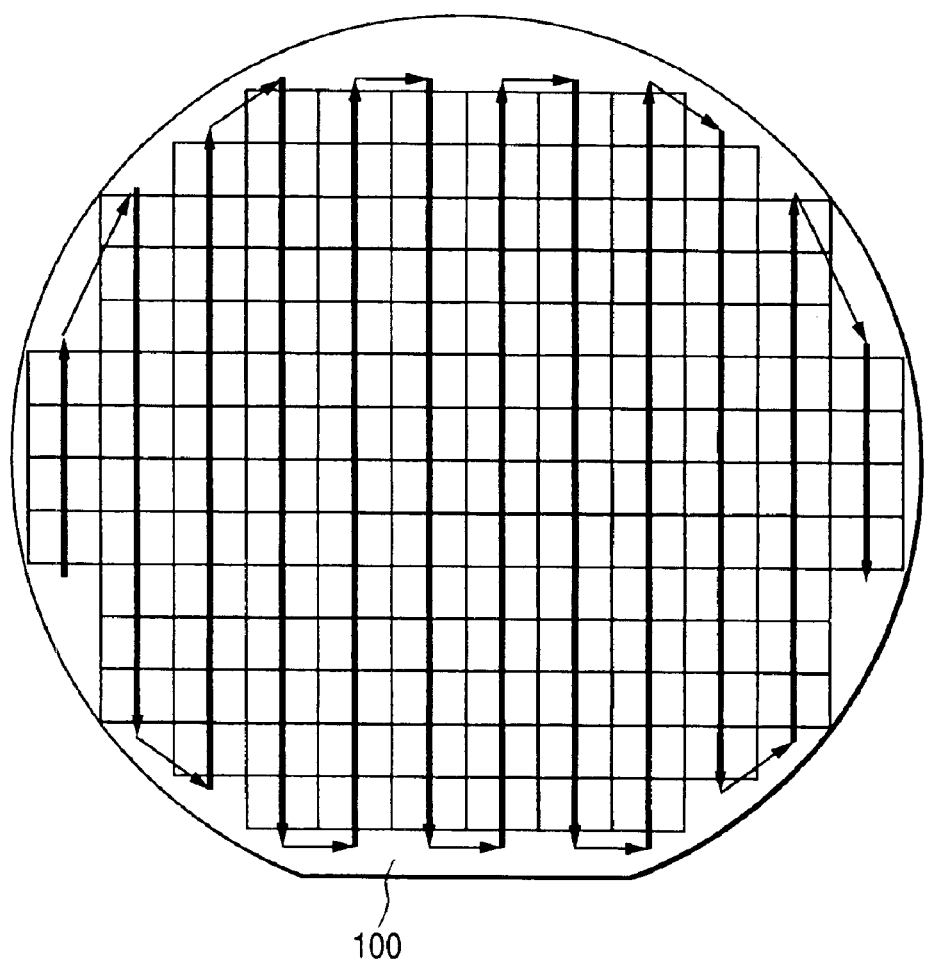
FIG. 14 is a plan view of a wafer for explaining the scanning method on the wafer.

A die 152 on the wafer 100 has the identical wiring patterns in the unit for producing products which are finally divided. The secondary electron 7 generated from the wafer 100 is detected with the 4-split detector 20, amplified with the preamplifiers 21a to 21d, added and A/D-converted with the A/D converter to obtain the digital image of the stripe area 154. The obtained digital image is stored in the memory 109. Here, after completion of scanning of the stage 6, the Z-sensor 113 is invalidated. With repetition of the scanning of stage, the entire part of area required is inspected completely. On the occasion of inspecting the entire part of wafer 100, inspection is performed in the sequence illustrated in FIG. 14.

Here, the 4-split detector 20 has the structure and function identical to that of FIG. 2.

In the case where the A detecting position 155 is detected with the image processing circuit 10, the detecting position is compared with the image of the B detecting position 156 stored in the memory 109 and the area generating the difference is extracted as a defect 11, a list of the pattern defect 11 is generated and is then transmitted to the complete control unit 110.

According to this embodiment, the entire part of the wafer is inspected using the SEM image to detect only the pattern defect 11 and these defects can be presented to users.

According to this embodiment, since the 4-split detector 20 of 200 MHz is used, the total and sufficient area and high-speed characteristic can be obtained, high-speed characteristic can be assured through amplification in which the respective bandwidths are maintained in the preamplifiers 21a to 21d. Moreover, the signals are added and A/D-converted and thereby the S/N ratio can be doubled in comparison with that of only one detector.

Figure 4:
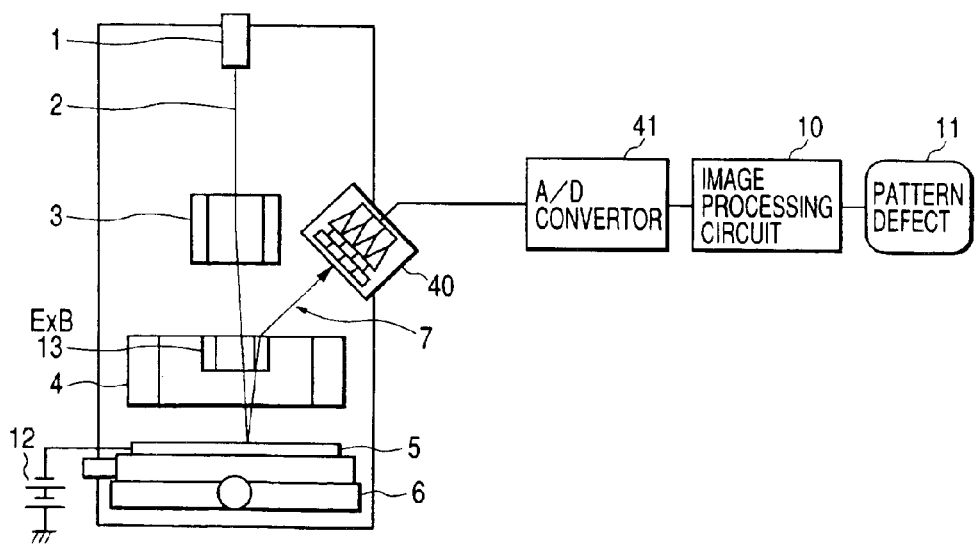
FIG. 4 is a front elevation illustrating the schematic structure of the third means of the present invention.

Next, the first modification example of the present embodiment will be explained. In this first modification example, a smart detector which integrates the 4-split sensor 20, preamplifiers 21a to 21d and the circuit for adding outputs of the preamplifiers are integrated as illustrated in FIG. 4. According to this modification example, since the sensor and preamplifiers are integrated and only one output can be obtained on the occasion of realizing high-speed operation of 400 Msps or more, it is possible to easily increase the number of divisions.

Next, the second modification example of the present embodiment will be explained. In this modification example, a smart detector integrating the 4-split sensor 20 and preamplifiers 21a to 21d is used (not illustrated). Namely, in this modification example, a circuit for addition is separated from the smart detector of the first modification example as illustrated in FIG. 4 and the 4-split detector 20 and the preamplifiers 21a to 21d are integrated in the structures illustrated in FIG. 2 and FIG. 12. According to this modification example, since the sensor and preamplifiers are integrated to realize the high-speed operation of 400 Msps or more, the number of divisions can easily be increased. Moreover, since outputs of the preamplifiers are individually provided, it can easily be realized to provide the arithmetic functions in addition to the addition.

Next, the third modification example of the present embodiment will be explained. In the structure illustrated in FIG. 12, this modification example uses a smart detector integrating the 4-split sensor 20, preamplifiers 21a to 21d, an arithmetic circuit having one or a plurality of outputs and an A/D converter for A/D-converting the output of one or a plurality of arithmetic circuits. According to this modification example, since the sensor and preamplifier are integrated for high-speed operation of 400 Msps or more, the number of divisions may be increased easily.

Next, the fourth modification example of the present embodiment will be explained. In this modification example, the sequence of addition and A/D conversion are replaced with each other for the first modification example. Namely, outputs of the preamplifiers 21a to 21d are once A/D-converted and these outputs are added or arithmetically operated after the A/D conversion. According to this modification example, the characteristics of the 4-split detector 20 and preamplifiers 21a to 21d can be compensated with the arithmetic operations.

The first embodiment and its modification examples have been explained above but in this embodiment and its modification examples, not only the outputs of the 4-split detector 20 are simply added but also the linear or non-linear arithmetic processes may be executed for the outputs of respective detection elements.

Moreover, the light detecting surface of each element has different angles for observing the objects because the 4-split detector 20 which has been explained in the embodiment and its modification example is used. Therefore, the shape information including the projection and recess information of the object can be obtained at high speed by conducting the arithmetic operations for these outputs.

Figure 9:
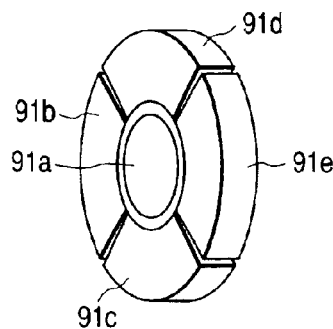
FIG. 9 is a diagram illustrating an example of structure of the detector in the present invention.

In addition, in the embodiment and its modification examples, the 4-split detector 20 is used as an example but the detector providing the other light detecting surface at the center area as illustrated in FIG. 9 can also be used.

According to this embodiment and its modification examples, it is also possible, without requesting remarkable modification in comparison with that in the related art, to detect the SEM image in the sampling frequency which is higher by two times or more than that of the apparatus of related art in the rather simplified structure of the optical system.

Moreover, according to the present embodiment and its modification examples, since the beam diameter of secondary electron can be detected in the same diameter as that of the apparatus of related art, a degree of contamination of the detector surface is same as that in the related art and therefore there is no disadvantage that the operating life of the detector can be shortened due to the high-speed detection.

In addition, according to the present embodiment and its modification examples, since the signals are processed by simultaneously receiving the outputs from the respective divided detectors, if there is fluctuation of sensitivity in the respective divided detectors, the outputs depending on such fluctuation can be obtained stably and such output signals can be processed rather easily.

[Embodiment 2]

Figure 15:
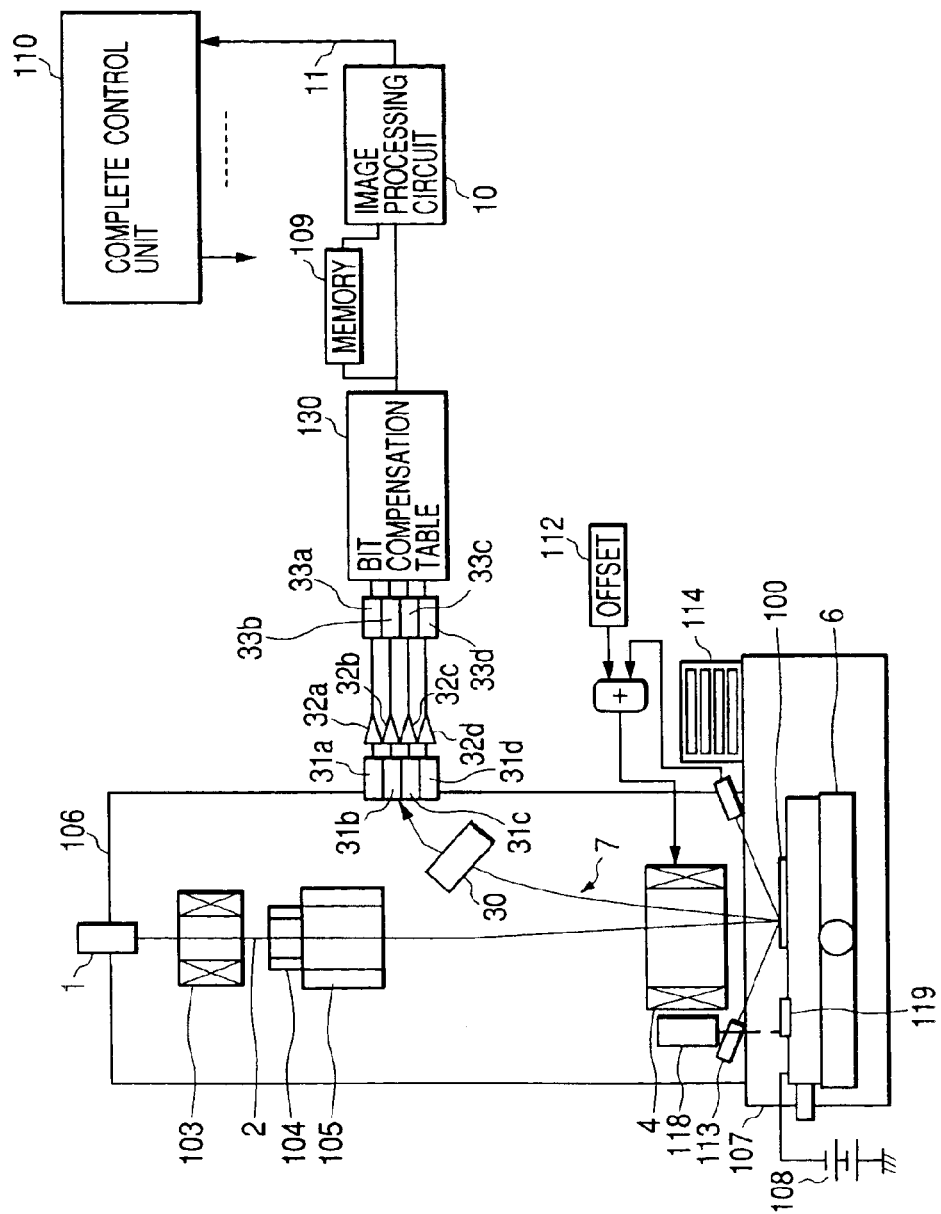
FIG. 15 is a front elevation illustrating the schematic structure in relation to the second embodiment of the present invention.

The second embodiment of the present invention will be explained. FIG. 15 illustrates a structure of the second embodiment, comprising an electron beam source 1 for generating the electron beam 2, an electro-optical system 106 consisting of a condenser lens 103 for converging the electron beam 2 from the electron beam source 1 to the constant area, a blanking plate 104 provided at the area near the converging position of the condenser lens 103 to control the on/off condition of the electron beam 2, a deflector 105 for deflecting the electron beam 2 in the XY directions and an objective lens 4 for converging the electron beam 2 on the object substrate 5, a sample chamber 107 for holding the wafer 100 as the object substrate under the evacuated condition, a stage 6 to load the wafer 100 for applying the retarding voltage 108 which enables the detection of an image of the desired position, a secondary electron deflector 30 for deflecting the secondary electron 7 from the object substrate 5, 4-split detectors 31a to 31d using four detection elements in the size of 2 mm square having the bandwidth of 50 MHz for detecting the secondary electron 7 deflected with the secondary electron deflector 30 from the object substrate 5, preamplifiers 32a to 32d having the bandwidth of 50 MHz, A/D converters 33a to 33d for obtaining the digital image by the A/D conversion of the outputs from the preamplifiers 32a to 32d, a bit compensation table 130 for compensating the characteristics of the detectors and preamplifiers provided for the A/D converters 33a to 33d, a memory 109 for storing the compensated digital images, an image processing circuit 10 for comparing the image stored in the memory 109 and the digital image after the A/D conversion and detecting the area generating difference as the pattern defect 11, a complete control unit 110 (the control line from the complete control unit 110 is omitted in the figure), a Z-sensor 113 for keeping constant the focal position of the digital image detected by measuring the height of wafer 100 and controlling the current value of objective lens 4 with addition of the offset 112, a loader (not illustrated) for loading and unloading the wafer 100 in the cassette 114 into and from the sample chamber 107, an orientation flat detector (not illustrated) for positioning the wafer 100 with reference to the external shape of the wafer 100, an optical microscope 118 for observing the patterns on the wafer 100 and a standard sample piece 119 provided on the stage 6.

Operations of the second embodiment will be explained. First, the bit compensation table is preset with the system explained later. The complete control unit 110 instructs the operations to each unit in the following sequence. When an instruction is issued to the loader (not illustrated), the loader picks up the wafer 100 from the cassette 114, positions the wafer 100 with reference to the external shape with the orientation flat detector (not illustrated), loads the wafer 100 to the stage 6 and evacuates the inside of sample chamber 107. Upon completion of the loading, of wafer, the conditions of electro-optical system 106 and retarding voltage 108 are set and a voltage is applied to the blanking plate 104 to turn off the electron beam 2.

Next, the stage is moved to the standard sample piece 119, the Z-sensor 113 is validated to keep the focal point to the constant value of the detection value of the Z-sensor+offset 112, the deflector 105 is caused to conduct the raster scanning and the voltage of the blanking plate 104 is turned OFF in synchronization with the scanning, the wafer 100 is irradiated only when it is required with the electron beam 2 and the secondary electron 7 generated from the wafer 100 in the secondary electron deflector 30 is inputted to the 4-split detectors 31a to 31d through the sequential switching in the form of a ring. The detected signal is converted to the digital image with the respective preamplifiers 32a to 32d and A/D converters 33a to 33d. Here, the offset 112 is changed to detect a plurality of digital images and the optimum offset which provides the maximum total sum of the images of differentiation value in the complete control unit 110 is set as the current offset value for each detection.

Next, the stage 6 is moved to the scanning start position of the area to be inspected of the loaded wafer 100. The intrinsic offset of wafer previously measured is added to the offset 112 and the added offset value is set to validate the Z-sensor 113, the stage 6 is scanned in the Y direction along the scanning line 153 in FIG. 13, the deflector 105 is scanned in the X direction in synchronization of scanning of stage, the voltage of the blanking plate 104 is turned off during the valid scanning and thereby the wafer 100 is irradiated and scanned with the electron beam 2. In regard to the secondary electron 7 generated from the wafer 100, the reflected electron or secondary electron generated from the wafer 100 with the secondary electron deflector 30 is inputted to the 4-split detectors 31a to 31d through the sequential switching with the circle scanning 92 shown in FIG. 11.

The detected signal is respectively converted to the digital images of the stripe area 154 with the preamplifiers 32a to 32d and A/D converters 33a to 33d and these digital images are stored in the memory 109.

After the completion of scanning of the stage 6, the Z-sensor 113 is invalidated. With repetition of the stage scanning, the entire surface of necessary area is inspected. In the case of inspecting the entire surface of wafer 100, inspection is performed in the sequence illustrated in FIG. 14. When the A detecting position 155 is detected with the image processing circuit 10, the area generating difference through comparison with the image of the B detecting position 156 stored in the memory 109 is detected as a pattern defect 11, a list of the pattern defect 11 is generated and it is then transmitted to the complete control unit 110.

Figure 10:
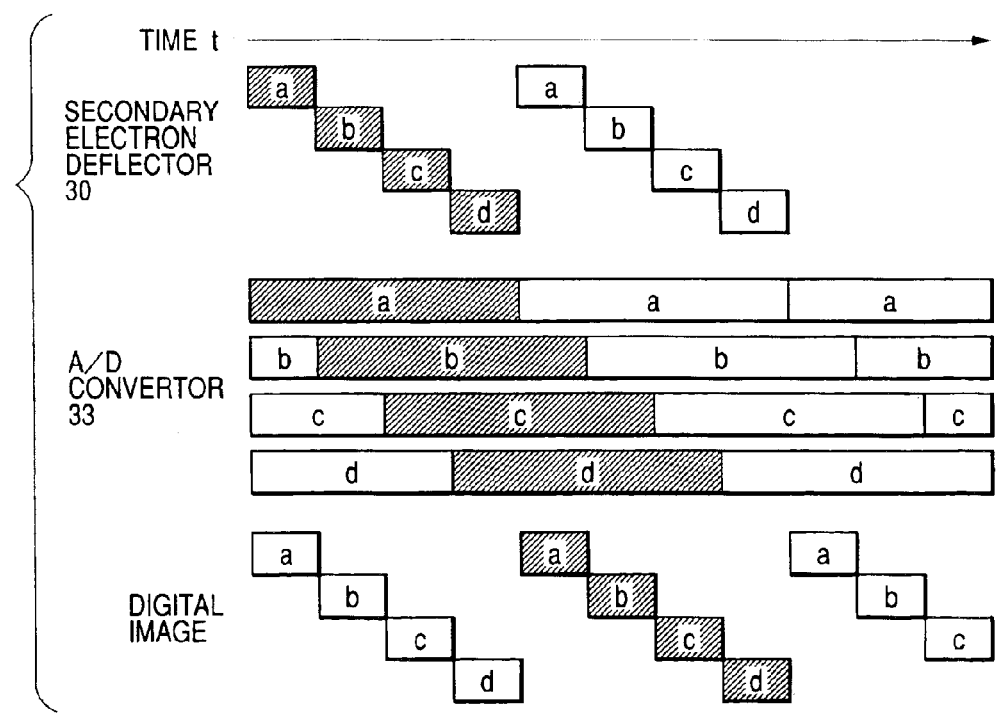
FIG. 10 is a diagram illustrating an operating method of the second means of the present invention.

Operations of the secondary electron deflector 30, 4-split detectors 31a to 31d, preamplifiers 32a to 32d and A/D converters 33a to 33d will be explained in detail. FIG. 10 illustrates the timing chart. In the secondary detectors 31a to 31d, preamplifiers 32a to 32d and A/D converters 33a to 33d, the sampling is conducted at 100 Msps to obtain the digital image. The digital image data corresponding to 400 Msps can be attained by arranging sequentially the digital images obtained.

Figure 3:
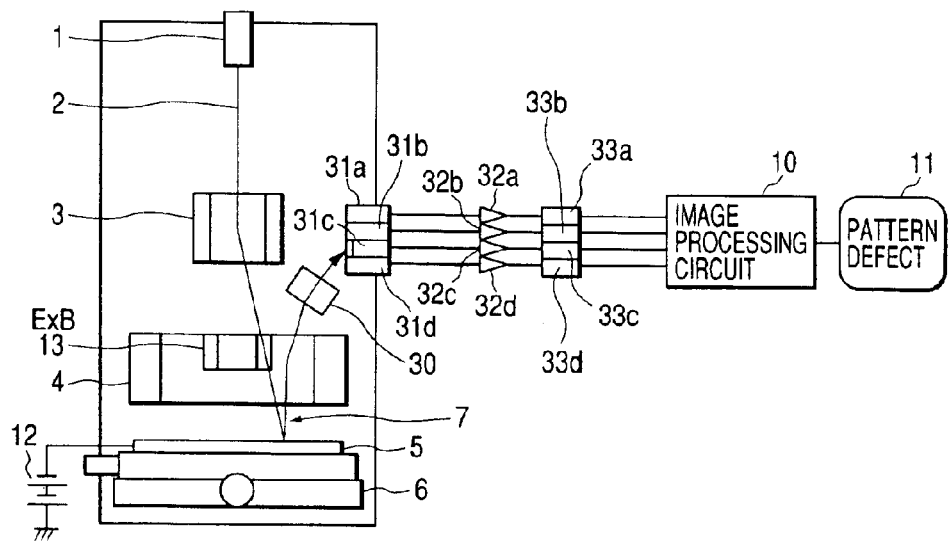
FIG. 3 is a front elevation illustrating the schematic structure of the second means of the present invention.

The 4-split detectors 31a to 31d explained here have the same structure as that of detectors explained in FIG. 3.

The bit compensation table 130 outputs, for each A/D converter 33a to 33d, the value after compensation $fa(x)$ to $fd(x)$ for the output value x of the A/D conversion. The reference A/D converter is defined as 33a and $fa(x)$ is defined as x ($fa(x)=x$). Next, the shape of functions of $fb(x)$ to $fd(x)$ is adjusted so that the value after detection and compensation of the blank wafer composed of various materials become identical.

According to this embodiment, the entire surface of wafer is inspected using the SEM image and only the pattern defect 11 is detected and these defects are presented to users.

A modification example of this embodiment will be explained.

Figure 11:
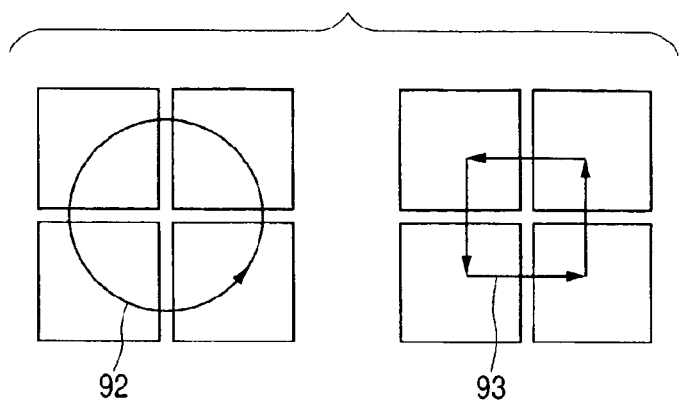
FIG. 11 is a plan view of the detector indicating the operation on the detector of the secondary electron by the secondary electron deflector.

In the first modification example, as the scanning method of the secondary electron deflector 30, the switching scanning 93 is used in place of the circle scanning 92 among the scanning method illustrated in FIG. 11. This modification example as a characteristic that since the scanning of secondary electron on the 4-split detectors 31a to 31d is not the analogous scanning, the scanning is resistive to fluctuation factor such as drift of position on the 4-split detectors 31a to 31d of the secondary electron 7.

In the second modification example, a circuit for linear arithmetic operation is provided in place of the bit compensation table 130 to compensate for the characteristics of the detector and preamplifier. According to this modification example, there is provided the characteristic that high-speed processing can be realized with a more simplified circuit.

According to the second embodiment and its modification example, since the detection rate of N times the operation rate of individual detectors can be realized, the higher-speed detection can also be realized.

[Embodiment 3]

Figure 16:
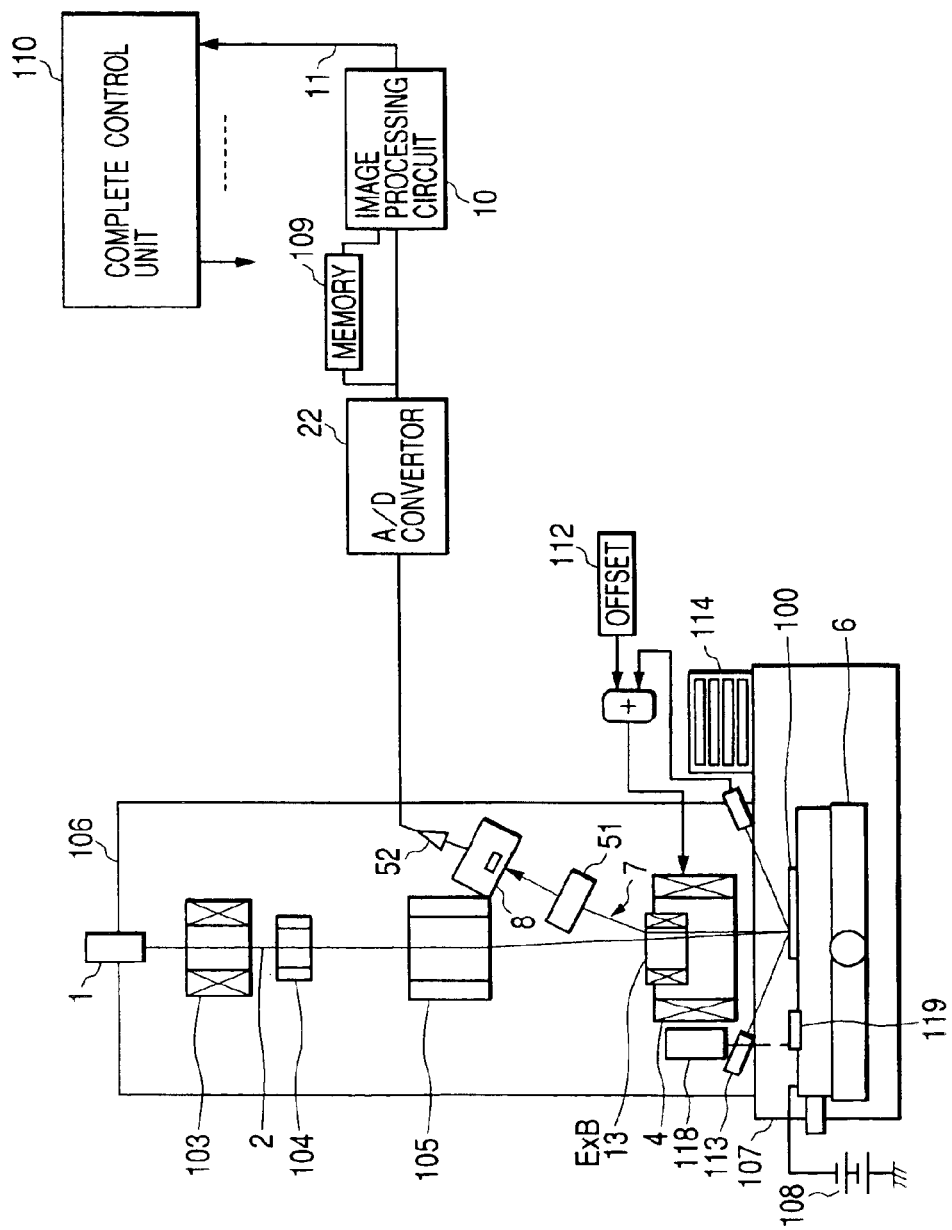
FIG. 16 is a front elevation illustrating the schematic structure of the apparatus in relation to the third embodiment of the present invention.

The third embodiment of the present invention is explained. FIG. 16 illustrates a structure of the third embodiment, comprising an electron beam source 1 for generating the electron beam 2, an electro-optical system 106 consisting of a condenser lens 103 for converging the electron beam 2 from the electron beam source 1 to the constant area, a blanking plate 104 provided at the area near the converging position of the condenser lens 103 for controlling the on/off condition of the electron beam 2, a deflector 105 for deflecting the electron beam 2 in the XY direction and an objective lens 4 converging the electron beam 2 on the object substrate 5, a sample chamber 107 for holding a wafer 100 as the object substrate in the evacuated condition, a stage 6 for loading the wafer 100 to apply the retarding voltage 108 to enable detection of the image at the desired position, E×B 13 for deflecting the secondary electron 7 from the object substrate 5 toward the detector 8, a converging optical system 51 for converging the deflected secondary electron 7, a detector 8 having the bandwidth of 200 MHz for detecting the secondary electron 7 converted with the converging optical system, a preamplifier 52 having the bandwidth of 200 MHz allocated in the sample chamber held in the evacuated condition, an A/D converter 22 for obtaining the digital image from the output of the preamplifier 52 through the A/D conversion at 400 Msps, a memory 109 for storing the digital images, an image processing circuit 10 for comparing the image stored in the memory 109 and the digital image obtained through the A/D conversion to detect the area generating difference as the pattern defect 11, a complete control unit 110 (the control line from the complete control unit 110 is omitted in the figure), a Z-sensor 113 for keeping constant the focal position of digital image by measuring the height of the wafer 100 and controlling a current value of the objective lens 4 with addition of offset 112, a loader (not illustrated) for loading and unloading the wafer 100 in the cassette 114 to and from the sample chamber 107, an orientation flat detector (not illustrated) for positioning the wafer 100 with reference to the external shape of the wafer 100, an optical microscope 118 for observing the patterns on the wafer 100 and a standard sample piece 119 provided on the stage 6.

Figure 5:
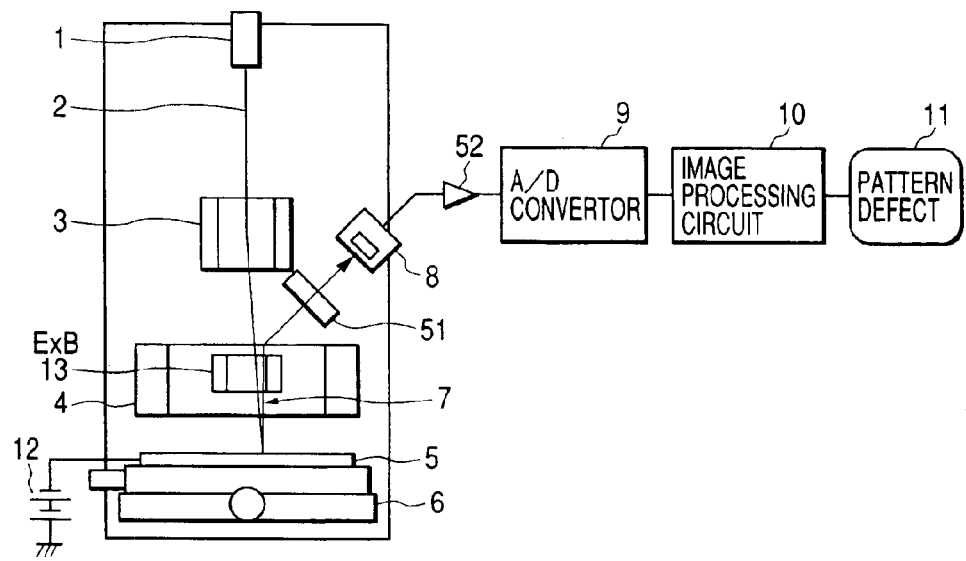
FIG. 5 is a front elevation illustrating the schematic structure of the fourth means of the present invention.

Here, the detector 8 has the structure identical to that illustrated in FIG. 5.

Operations of the third embodiment will be explained. The complete control unit 110 instructs the operation of each unit in the following procedures. When the instruction is issued to the loader (not illustrated), the loader picks up the wafer 100 from the cassette 114, positions the wafer with reference to the external shape with the orientation flat detector (not illustrated), loads the wafer 100 to the stage 6 and evacuates the sample chamber 107. Upon loading of the wafer 100, the electro-optical system 106, retarding voltage 108 and conditions depending on the retarding voltage 108 are set to the converging optical system 51 and a voltage is applied to the blanking plate 104 to cut off the electron beam 2.

Next, the stage is moved to the standard sample piece 119 and makes valid the Z-sensor 113 to keep the focal point to the constant value of the detection value of Z-sensor 113+ offset 112, the deflector 105 is caused to execute the raster scanning, the voltage of the blanking plate 104 is cut off in synchronization with the scanning, the wafer 100 is irradiated with the electron beam 2 only when it is required, the secondary electron 7 generated from the wafer 100 at this time is detected with the detector 8 via the converging optical system 51 and this secondary electron 7 is converted to the digital image with the A/D converter 22. The offset 112 is changed to detect a plurality of digital images and the optimum offset which provides the maximum sum of images of the differentiation value of the image in the complete control unit 110 for each detection is set as the current offset value.

Next, the stage 6 is moved to the scanning start position of the area to be inspected of the wafer 100 loaded. The intrinsic offset of wafer previously measured is added to the offset 112 for the setting, the Z-sensor 113 is validated, the stage 6 is scanned in the Y direction along the scanning line 153 of FIG. 13, the deflector 105 is scanned in the X direction in synchronization of the scanning of stage, the voltage of the blanking plate 104 is cut out during effective scanning and the wafer 100 is irradiated and scanned with the electron beam 2. The die 152 on the wafer 100 is finally separated and has the identical wiring patterns in the units of products. The secondary electron 7 generated from the wafer 100 is detected with the detector 8 and amplified with the preamplifier 52. Thereafter, the digital image of the stripe area 154 is obtained with the A/D converter 22 and is then stored in the memory 109. After the scanning of the stage 6, the Z-sensor 113 is invalidated. With repetition of the scanning of stage, the necessary inspection for the entire part of area is conducted. In the case of inspecting the entire part of the wafer 100, inspection is conducted in the sequence illustrated in FIG. 14.

When the image processing circuit 10 detects the A detecting position 155, this image is compared with the image of the B detecting position 156 stored in the memory 109 and the area generating difference is extracted as the defect 11, a list of the pattern defects 11 is generated and it is then transmitted to the complete control unit 110.

According to this embodiment, the entire part of wafer is inspected using the SEM image, only the pattern defect 11 is detected and it is then presented to a user.

Moreover, according to this embodiment, the converging position of the secondary electron 7 depending on the retarding voltage 108 is adjusted with the converging optical system 51 and the detector 8 of 200 Msps is used, high speed operation can be assured and all secondary electron or the like can be converged to the detector 8.

Moreover, according to this embodiment, since detection is conducted with only one detector, fluctuation of detection signal is small and the signal can be detected stably. Thereby, the signal processing circuit can be formed in the rather simplified structure.

Next, a modification example of the present embodiment will be explained.

Figure 6:
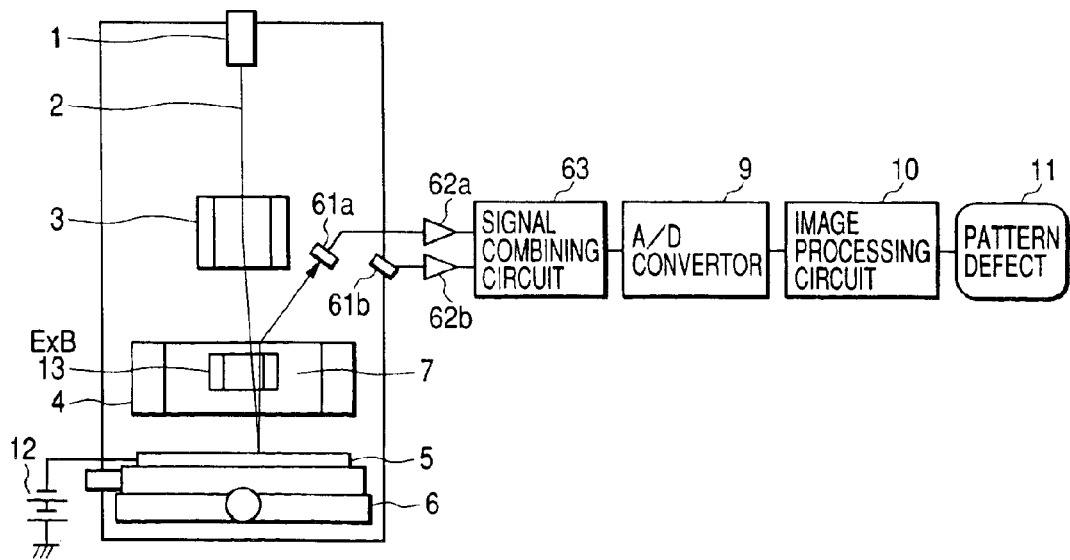
FIG. 6 is a front elevation illustrating the schematic structure of the fifth means of the present invention.

In the first modification example, a plurality of detectors 61a, 61b are allocated at the positions depending on the retarding voltage 108 as illustrated in FIG. 6 and these are used through the switching in place of that change of the converging position of the secondary electron 7 depending on t he retarding voltage 108 is adjusted using the converging optical system 51 of FIG. 5 or FIG. 16 and it is then incident to the detector 8. This modification example is characterized in that appropriate measure can be assured even in the case where the detectors 61a, 61b must be allocated at the distant area because of the spatial limitation.

Figure 7:
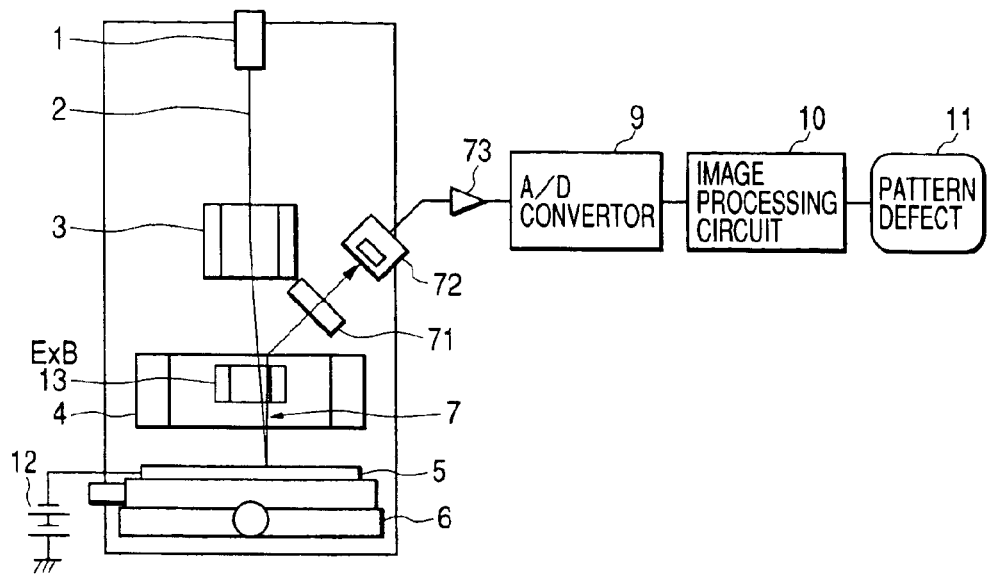
FIG. 7 is a front elevation illustrating the schematic structure of the sixth means of the present invention.

Next, in the second modification example, the converging optical system 51 of FIG. 5 or FIG. 16 is replaced with a returning deflector 71 as illustrated in FIG. 7. This modification example is characterized in that more stable secondary electron 7 can be converged to the detector 8 because displacement of secondary electron 7 due to the influence of deflector 105 can be compensated.

Figure 8:
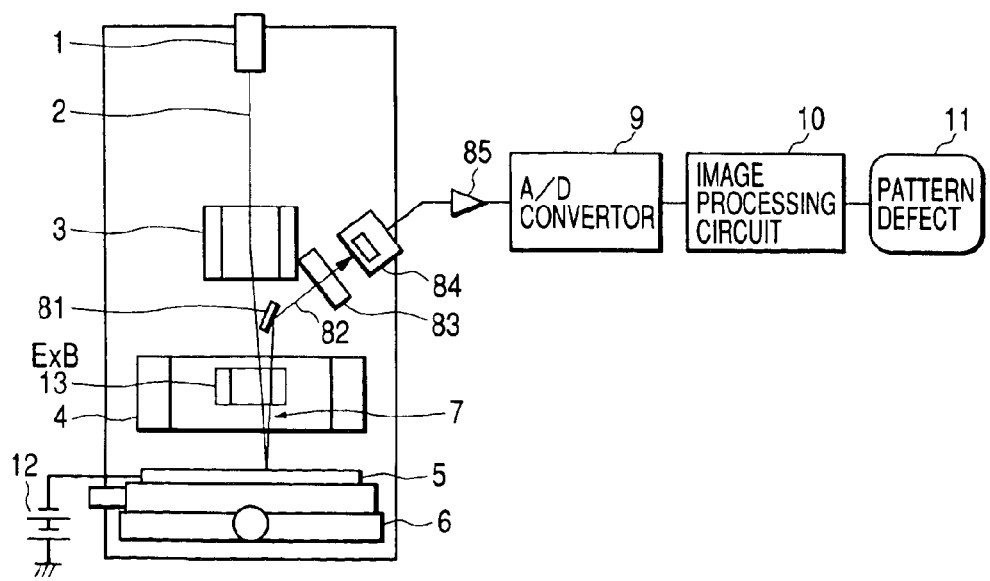
FIG. 8 is a front elevation illustrating the schematic structure of the seventh means of the present invention.

Next, in the third modification example, the reflector 81 is added as illustrated in FIG. 8, the secondary electron 7 is collided with this reflector 81 and the secondary electron 82 generated in this case is then converged to the detector 8 with the converging optical system 51. According to this modification example, the secondary electron 7 can be detected effectively by stably converging it to the detector 8.

As explained above, according to the present invention, it is possible that the digital images can be detected with the sampling frequency of 200 Msps or higher and the SEM image can be processed at the high-speed.

In addition, in the case where the entire part of the wafer in diameter of 200 mm is inspected at the speed of 100 Msps in the pixel unit of 0.1 µm using the technique of the related art, about 15 hours have been required. However, when the wafer is detected in the rate of 400 Msps in the system of the present invention, such detection can be done with only about five hours even if the moving time of stage and scanning time of electron beam are included. Moreover, when the wafer is detected at the rate of 200 Msps in the system of the present invention, such inspection can be made with only about 8 hours.

Thereby, the result of inspection can be reflected quickly on the manufacturing process.

Moreover, the apparatus of the present invention realizes that the wafers of three times can be inspected with the same inspection time in comparison with the existing apparatus.

The invention may be embodied in other specific forms without departing from the spirit or essential characteristics thereof. The present embodiment is therefor to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A pattern inspection method comprising the steps of:
   irradiating a charged particle beam onto a surface of a specimen on which a pattern is formed;
   detecting with plural sensors, each of which is integrated with a preamplifier, secondary particles emanated from the surface of the specimen by the irradiation;
   adding signals simultaneously outputted from each sensor of the plural sensors which detected the secondary particles and amplified by said integrated preamplifiers;
   obtaining an image of the surface of the specimen on which the pattern is formed from the added signals; and
   processing the image to detect a defect of the pattern.

2. A pattern inspection method as claimed in claim 1, wherein the signals outputted from each sensor of the plural sensors are integrated and processed.

3. A pattern inspection method as claimed in claim 1, wherein each sensor of the plural sensors is a divided part of one sensor.

4. A pattern inspection method comprising the steps of:
   irradiating a charged particle beam onto a surface of a specimen on which a pattern is formed;
   detecting with plural sensors, each of which is integrated with a preamplifier, at least one of secondary electron, reflected electron and transparent electron emanated from said specimen by the irradiation of the charged particle beam;
   obtaining digital images at the rate of at least 200 Msps through arithmetic operation of signals simultaneously outputted by the plural sensors and amplified by said integrated preamplifiers; and
   detecting a defect of the pattern by processing the obtained digital images.

5. A pattern inspection method as claimed in claim 4, wherein each sensor of the plural sensors in a divided part of one sensor.

6. A pattern inspection apparatus comprising:
   a charged particle beam irradiating device for irradiating a charged particle beam on a surface of a specimen on which a pattern is formed;
   a detector provided with plural sensors, each of which is integrated with a preamplifier, for detecting with the plural sensors secondary charged particles emanated from the specimen by the irradiation of the charged particle beam by the charged particle beam irradiating device;
   an image obtaining device for obtaining digital images by adding signals simultaneously outputted from each sensor of the detector and amplified by said integrated preamplifiers and obtaining from the added signals an image of the surface of the specimen on which the pattern is formed; and
   a defect detector for detecting a defect of the pattern formed on the specimen by processing the digital images obtained by the image obtaining device.

7. A pattern inspection apparatus as claimed in claim 6, wherein each sensor of the detector is a divided part of one sensor.

8. A pattern inspection apparatus as claimed in claim 6, wherein said image obtaining device obtains digital images at a rate of at least 200 Msps.

9. A pattern inspection apparatus comprising:
   a charged particle beam irradiating device for irradiating a charged particle beam on a surface of a specimen on which a pattern is formed;
   a detector having plural sensors, each of which is integrated with a preamplifier, for detecting with the plural sensors secondary charged particles emanated from the specimen by the irradiation of the charged particle beam by the charged particle beam irradiating device; and
   a processor for processing signals simultaneously outputted from each sensor of the detector through said integrated preamplifier by adding the signals outputted from each sensor to obtain an image of the surface of the specimen on which the pattern is formed and detecting a defect of the pattern by processing the obtained image.

10. A pattern inspection apparatus as claimed in claim 9, wherein each sensor of the detector is a divided part of one sensor.

11. A pattern inspection apparatus as claimed in claim 9, wherein said processor obtains the image at a rate of at least 200 Msps.

* * * * *